(12) United States Patent
Ng et al.

(10) Patent No.: US 7,647,543 B2
(45) Date of Patent: Jan. 12, 2010

(54) REPROGRAMMABLE FIELD PROGRAMMABLE GATE ARRAY WITH INTEGRATED SYSTEM FOR MITIGATING EFFECTS OF SINGLE EVENT UPSETS

(75) Inventors: Tak-kwong Ng, Yorktown, VA (US); Jeffrey A. Herath, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 11/535,574

(22) Filed: Sep. 27, 2006

(65) Prior Publication Data

US 2007/0176627 A1   Aug. 2, 2007

Related U.S. Application Data

(60) Provisional application No. 60/774,811, filed on Feb. 1, 2006.

(51) Int. Cl.
*H03M 13/00* (2006.01)
*G08C 25/02* (2006.01)
*G11C 29/00* (2006.01)

(52) U.S. Cl. .................. 714/754; 714/748; 714/731; 714/763; 714/764; 326/9; 326/15

(58) Field of Classification Search ............... 714/763, 714/718, 725, 754, 731, 748; 326/38–40, 326/9–15
See application file for complete search history.

(56) References Cited

U.S. PATENT DOCUMENTS

| 6,237,124 | B1 * | 5/2001 | Plants | 714/763 |
| 7,263,631 | B2 * | 8/2007 | VanBuren | 714/15 |
| 7,310,759 | B1 * | 12/2007 | Carmichael et al. | 714/725 |
| 2004/0078103 | A1 * | 4/2004 | Marshall et al. | 700/87 |
| 2006/0020774 | A1 * | 1/2006 | Ramos et al. | 712/226 |
| 2006/0036909 | A1 * | 2/2006 | VanBuren | 714/15 |
| 2007/0168718 | A1 * | 7/2007 | Reblewski et al. | 714/15 |

* cited by examiner

*Primary Examiner*—Vibol Tan
(74) *Attorney, Agent, or Firm*—Helen M. Galus

(57) ABSTRACT

An integrated system mitigates the effects of a single event upset (SEU) on a reprogrammable field programmable gate array (RFPGA). The system includes (i) a RFPGA having an internal configuration memory, and (ii) a memory for storing a configuration associated with the RFPGA. Logic circuitry programmed into the RFPGA and coupled to the memory reloads a portion of the configuration from the memory into the RFPGA's internal configuration memory at predetermined times. Additional SEU mitigation can be provided by logic circuitry on the RFPGA that monitors and maintains synchronized operation of the RFPGA's digital clock managers.

18 Claims, 1 Drawing Sheet

REPROGRAMMABLE FIELD PROGRAMMABLE GATE ARRAY WITH INTEGRATED SYSTEM FOR MITIGATING EFFECTS OF SINGLE EVENT UPSETS

ORIGIN OF THE INVENTION

This invention was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to reprogrammable "field programmable gate arrays" (FPGAs). More specifically, the invention is a system that is integrated on a reprogrammable FPGA that can mitigate the effects of single event upsets such as those induced in a reprogrammable FPGA operating in a radiation environment.

2. Description of the Related Art

A "field programmable gate array" or FPGA is a semiconductor device containing programmable logic components and programmable interconnects. The programmable logic components can be programmed to duplicate the functionality of basic logic gates or more complex combinatorial functions such as decoders or simple math functions. In most FPGAs, these programmable logic components or logic blocks also include memory elements which can be simple flip-flops or more complete blocks of memory.

A reconfigurable or "reprogrammable" FPGA is an FPGA that can be changed to form different logic functions on demand. The logic circuits in a reprogrammable FPGA generally employ bi-stable data storage elements within which the logic configuration data is stored. A data storage element's "state" (i.e., either a logical "one" or logical "zero") determines whether or not the "device" (e.g., logic, configuration interface gate, etc.) connected to the data storage element's output is either on or off. In that way, blocks of logic elements are connected/disconnected to thereby configure the logic circuit. Selectively changing the data stored in some of the data storage elements allows one to reconfigure the logic circuits. Such reconfigurable logic circuits offer a significant advantage over one-time programmable "firm" logic circuits in that the hardware can be changed even after the digital system has been deployed for many years.

The versatility offered by reprogrammable FPGAs make them ideally suited for a variety of applications to include aerospace. However, aerospace applications often involve environments where radiation is present. Radiation can induce an error in a reprogrammable FPGA known as a "single event upset" (SEU). SEUs can be defined as radiation-induced errors in microelectronic circuits caused when charged particles lose energy by ionizing the medium through which they pass leaving behind a wake of electron-hole pairs. SEUs are transient soft errors, and are non-destructive. Unfortunately, reprogrammable FPGAs are very susceptible to SEUs.

Currently, systems using reprogrammable FPGAs that will be exposed to radiation are designed using radiation tolerant components for the mitigation of SEUs. These radiation tolerant components are in addition to the reprogrammable FPGAs configured for a user application. However, requiring additional radiation tolerant components for SEU mitigation increases the complexity of the overall system design, increases the number of components, requires a greater amount of board space, is more expensive, requires more power for system implementation, and reduces overall system reliability.

SUMMARY OF THE INVENTION

Accordingly, it is an object of the present invention to provide a system that can mitigate the effects that a single event upset has on a reprogrammable FPGA.

Another object of the present invention is to provide a system that can mitigate the effects that a radiation-induced single event upset has on a reprogrammable FPGA without the need for additional radiation tolerant components.

Other objects and advantages of the present invention will become more obvious hereinafter in the specification and drawings.

In accordance with the present invention, a system is provided that can mitigate the effects of a single event upset (SEU) on a reprogrammable field programmable gate array (RFPGA). The requisite hardware includes (i) a RFPGA having an internal configuration memory, and (ii) a memory for storing a configuration associated with the RFPGA. With respect to SEU mitigation, logic circuitry programmed into the RFPGA and coupled to the memory reloads a portion of the configuration from the memory into the RFPGA's internal configuration memory at predetermined times. Optionally, additional SEU mitigation logic circuitry can be programmed into the RFPGA. The additional logic circuitry is coupled to at least one multiple of three of the RFPGA's digital clock managers and maintains synchronized operation thereof.

BRIEF DESCRIPTION OF THE DRAWINGS

The sole FIGURE is a block diagram of a system for mitigating the effects of a single event upset on a reprogrammable FPGA in accordance with an embodiment of the present invention.

DETAILED DESCRIPTION OF THE INVENTION

Figure 1:
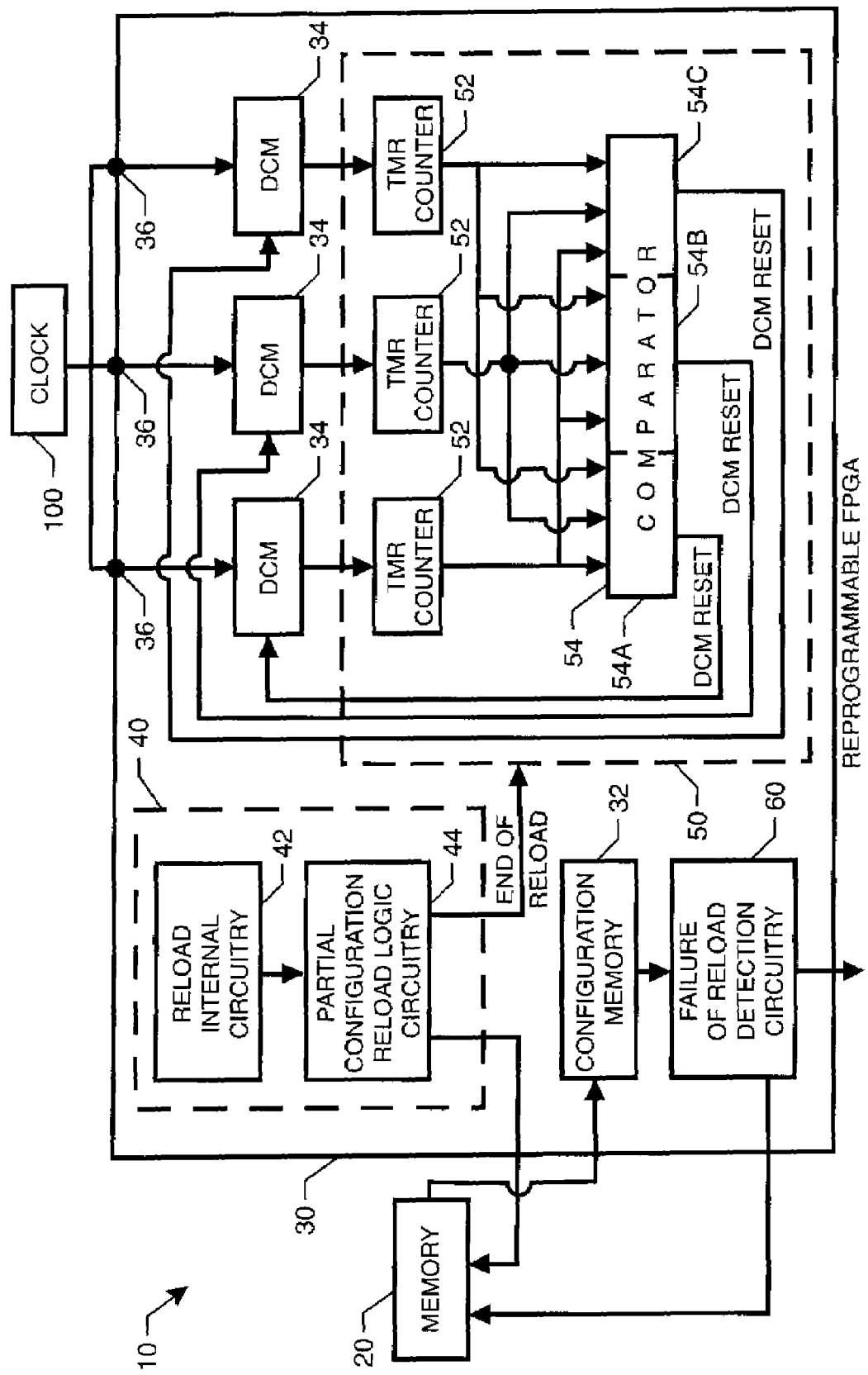

Referring now to the sole FIGURE, a system for mitigating the effects of a "single event upset" (SEU) on a "reprogrammable FPGA" (hereinafter referred to as a "RFPGA") is shown and is referenced generally by numeral 10. System 10 is typically part of some larger set of components (not shown) that is designed to perform an application function. The particular application is not part of the present invention or a limitation thereof. Furthermore, the particular cause/source of the SEU is not a limitation of the present invention. Typically, in an aerospace application, the SEU is radiation-induced as charged particles from radiation belts or cosmic rays lose energy as they pass through a medium.

In general and from a hardware perspective, system 10 includes a memory 20 (e.g., an "electrically erasable programmable read only memory" or EEPROM) and an RFPGA 30. Memory 20 stores a user-specified configuration in terms of a configuration sequence (i.e., the stream of digital "1's" and "0's" that provide for implementation of the RFPGA configuration). In the present invention, the RFPGA configuration is partially reloaded from memory 20 into an internal configuration memory 32 of RFPGA 30 in a periodic fashion. The RFPGA configuration stored in memory 20 is used to define the various logic circuits of RFPGA 30 that will perform (i) the SEU mitigation functions of the present invention, and (ii) the particular application functions of RFPGA 30. That is, the logic circuitry of RFPGA 30 is configured (using the RFPGA configuration) to facilitate SEU mitigation without requiring additional radiation tolerant components coupled to RFPGA 30. The description herein will focus only on the logic circuitry of RFPGA 30 that performs the SEU mitigation functions of the present invention. Accordingly, for clarity of illustration, most of the logic circuitry associated with the application functions of RFPGA 30 has been omitted from the figure. One exception to this is the illustration of three "digital clock managers" (DCMs) 34 of RFPGA 30 used for application functions of RFPGA 30. The significance of DCMs 34 in the present invention will be explained further below.

In terms of the present invention's integrated SEU mitigation function, logic circuits on RFPGA 30 are configured to perform one or two unique functions, the second of which is optional. These two functions can be described briefly as follows. Since SEUs affecting the configuration memory of RFPGA 30 can be corrected by a partial reloading of the RFPGA configuration, the first function is a periodic partial reloading of the RFPGA configuration stored in memory 20. This first function is carried out by logic circuitry illustrated in block diagram form within dashed-line box 40. For application functions that utilize DCMs 34, the partial reloading of the RFPGA configuration might not provide for an effective recovery from an SEU affecting DCMs 34. Accordingly, an optional second function of the present invention is to detect a SEU of the RFPGA's DCMs. In particular, the present invention utilizes the clock outputs of three DCMs 34 in the application function of RFPGA 30 in implementing this second function. The logic circuitry for performing this second function is illustrated in block diagram form within dashed-line box 50. Multiples of box 50 may also be utilized when there are like multiples of three DCMs 34 in the application function.

The first function provided by logic circuitry 40 will now be described in greater detail. As mentioned above, logic circuitry 40 partially reloads the RFPGA configuration from memory 20 into internal configuration memory 32. Logic circuitry 40 includes circuitry 42 that defines a periodic reload interval and circuitry 44 that initiates and controls a partial reloading of the RFPGA configuration (from memory 20) at the conclusion of each interval defined by circuitry 42. In the present invention, "partial reloading" is a selection by logic circuitry 44 of specific parts of the configuration sequence stored in memory 20. In general, "partial reloading" in the present invention excludes any parts of the configuration sequence that could alter the state of the RFPGA's application function logic. The particular portions of the configuration sequence that will be excluded in a particular situation is dependent on the type of RFPGA being used.

Multiple periodic intervals can be defined in the RFPGA configuration stored in memory 20 with the particular interval being user-selectable. The periodic interval (e.g., second, minute, hour, day, etc.) can be set in accordance with the timing of expected situations that might generate a SEU. In order to avoid conflicts between the configuration logic reload function and the optional DCM maintenance function, logic circuitry 40 can issue/provide an "END OF RELOAD" signal to logic circuitry 50.

The partial reload function of the present invention can be further enhanced by providing logic circuitry 60 that can detect failures in the operation of configuration memory 32 within RFPGA 30. If logic circuitry 60 detects such a failure event, it can initiate a complete reload of the RFPGA configuration from memory 20 and/or generate an error report for later analysis. A design for logic circuitry 60 is disclosed in co-pending patent application Ser. No. 11/531,703, the contents of which are hereby incorporated by reference. Briefly, logic circuitry 60 is configured as a self-detecting error module that monitors a selected key value for differences from the value stored during partial reloading, where such differences are indicative of a configuration logic reload failure.

The optional second function provided by logic circuitry 50 will now be described in greater detail. Logic circuitry 50 is coupled to three DCMs 34 that are available on RFPGA 30 and that are used in the RFPGA's application function. Multiples of box 50 are utilized when there are multiples of three DCMs 34 in the application function. Logic circuitry 50 monitors and maintains synchronized operation of DCMs 34 as a means to mitigate the effects of SEUs on the clock management function of RFPGA 30. As part of this function, each of three DCMs 34 receives the same clock signal from, for example, an external clock device 100 supplying the same clock signal to three separate input pins 36 of RFPGA 30. In response to the clock signal, each DCM 34 generates a clock output that is coupled to logic circuitry 50. More specifically, the clock output from each DCM 34 is coupled to a corresponding "triple module redundant" (TMR) counter 52. That is, each TMR counter 52 incorporates three separate copies of counter logic with each counter logic copy being driven by the same clock signal. TMR counters 52 are started synchronously and will, in normal operation, count in lock step. However, when one of DCMs 34 fails (e.g., due to a SEU), the TMR counter 52 associated with the failed DCM 34 will have a different count than the other two counters. The counts generated by TMR counters 52 are applied to a comparator 54.

In accordance with the present invention, comparator 54 also operates in a triple module redundant fashion. That is, comparator 54 will have three independently-operating comparator/voter sections 54A, 54B and 54C to perform the various counter comparisons and generate a "DCM RESET" (for the appropriate DCM 34) when such comparisons indicate DCM failure. Such triple module redundant comparisons are well understood in the art.

The advantages of the present invention are numerous. The RFPGA integrated SEU mitigation approach will protect a RFPGA's applications from SEU effects without requiring additional components. By periodically partially reloading a RFPGA's configuration, and optionally by monitoring/maintaining the synchronous operation of the RFPGA's DCMs, the present invention provides a simple approach to SEU mitigation that eliminates the need to have extensive knowledge of SEU mitigation techniques.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A system for mitigating the effects of a single event upset (SEU) on a reprogrammable field programmable gate array (RFPGA), comprising:

a RFPGA having an internal configuration memory;
a memory for storing a configuration associated with said RFPGA; and
reload means programmed into said RFPGA and coupled to said storing memory for selecting a portion of said configuration from said storing memory and reloading said portion into said internal configuration memory at predetermined time intervals, to thereby decrease the number of components, reduce expense and lessen the power for system implementation.

2. A system as in claim 1 wherein said storing memory is an electrically erasable programmable read only memory (EEPROM).

3. A system as in claim 1 wherein said configuration includes a definition of a plurality of said predetermined time intervals.

4. A system as in claim 1 wherein said predetermined time intervals are defined by a periodic recurrence of a time interval.

5. A system as in claim 1 wherein said reload means comprises means for defining said predetermined time intervals.

6. A system as in claim 1 wherein said storing memory is an electrically erasable programmable read only memory (EEPROM), and wherein said predetermined time intervals are defined by a periodic recurrence of a time interval defined in said configuration.

7. A system as in claim 1 wherein said RFPGA includes at least one multiple of three digital clock managers (DCMs), and wherein said system further comprises synchronizing means programmed into said RFPGA and coupled to said multiple of three DCMs for maintaining synchronized operation of said multiple of three DCMs.

8. A system for mitigating the effects of a single event upset (SEU) on a reprogrammable field programmable gate array (RFPGA), comprising:
   a RFPGA having an internal configuration memory;
   a memory for storing a configuration associated with said RFPGA; and
   reload means programmed into said RFPGA and coupled to said memory for reloading a portion of said configuration from said memory into said internal configuration memory at predetermined times;
   wherein said RFPGA includes at least one multiple of three digital clock managers (DCMs), and wherein said system further comprises synchronizing means programmed into said RFPGA and coupled to said multiple of three DCMs for maintaining synchronized operation of said multiple of three DCMs;
   wherein a synchronized clock signal is adapted to be coupled to each of said multiple of three DCMs wherein each of said multiple of three DCMs generates a clock output in response thereto, and wherein said synchronizing means comprises:
   at least one multiple of three triple module redundant (TMR) counters with each of said multiple of three TMR counters coupled to a corresponding one of said multiple of three DCMs to (i) receive a corresponding said clock output therefrom, and (ii) generate a corresponding counter output in response to said clock output, wherein a multiple of three counter outputs are generated; and
   comparison means coupled to said multiple of three TMR counters for performing comparisons between pairs of said multiple of three TMR counter outputs in a triple module redundant fashion and for re-synchronizing said multiple of three DCMs based on a failure of one of said comparisons.

9. A system as in claim 1 further comprising error detection means programmed into said RFPGA and coupled to said internal configuration memory for detecting errors in the operation thereof.

10. A system as in claim 9 wherein, when said errors are detected, said error detection means initiates a reloading of the entirety of said configuration from said memory into said internal configuration memory.

11. A system for mitigating the effects of a single event upset (SEU) on a reprogrammable field programmable gate array (RFPGA), comprising:
   a RFPGA having an internal configuration memory and having at least one multiple of three digital clock managers (DCMs);
   a memory for storing a configuration associated with said RFPGA;
   first means programmed into said RFPGA and coupled to said storing memory for selecting and reloading a portion of said configuration from said storing memory into said internal configuration memory at predetermined time intervals as defined by said configuration, to thereby decrease the number of components, reduce expense and lessen the power for system implementation; and
   second means programmed into said RFPGA and coupled to said multiple of three DCMs for maintaining synchronized operation of said multiple of three DCMs.

12. A system as in claim 11 wherein said storing memory is an electrically erasable programmable read only memory (EEPROM).

13. A system as in claim 11 wherein said predetermined time intervals are defined by a periodic recurrence of a time interval.

14. A system as in claim 11 wherein said first means comprises means for defining said predetermined time intervals.

15. A system as in claim 11 wherein said storing memory is an electrically erasable programmable read only memory (EEPROM), and wherein said predetermined time intervals are defined by a periodic recurrence of a time interval defined in said configuration.

16. A system for mitigating the effects of a single event upset (SEU) on a reprogrammable field programmable gate array (RFPGA), comprising:
   a RFPGA having an internal configuration memory and having at least one multiple of three digital clock managers (DCMs);
   a memory for storing a configuration associated with said RFPGA;
   first means programmed into said RFPGA and coupled to said memory for reloading a portion of said configuration from said memory into said internal configuration memory at predetermined times as defined by said configuration; and
   second means programmed into said RFPGA and coupled to said multiple of three DCMs for maintaining synchronized operation of said multiple of three DCMs;
   wherein a synchronized clock signal is adapted to be coupled to each of said multiple of three DCMs wherein each of said multiple of three DCMs generates a clock output in response thereto, and wherein said second means comprises:
   at least one multiple of three triple module redundant (TMR) counters with each of said multiple of three TMR counters coupled to a corresponding one of said multiple of three DCMs to (i) receive a corresponding said clock output therefrom, and (ii) generate a corresponding counter output in response to said clock output, wherein a multiple of three counter outputs are generated; and
   comparison means coupled to said multiple of three TMR counters for performing comparisons between pairs of said multiple of three TMR counter outputs in a triple module redundant fashion and for re-synchronizing said multiple of three DCMs based on a failure of one of said comparisons.

17. A system as in claim 11 further comprising error detection means programmed into said RFPGA and coupled to said internal configuration memory for detecting errors in the operation thereof.

18. A system as in claim 17 wherein, when said errors are detected, said error detection means initiates a reloading of the entirety of said configuration from said storing memory into said internal configuration memory.

* * * * *